US009863598B2

(12) United States Patent
Albou et al.

(10) Patent No.: US 9,863,598 B2
(45) Date of Patent: Jan. 9, 2018

(54) VEHICLE LIGHTING SYSTEM HAVING AN OSCILLATING REFLECTING BODY MOVED BY A PIEZOELECTRIC OPERATING MEMBER

(71) Applicant: Valeo Vision, Bobigny (FR)

(72) Inventors: Pierre Albou, Paris (FR); Jean-Claude Puente, Livry Gargan (FR); Vincent Godbillon, Paris (FR)

(73) Assignee: VALEO VISION, Bobigny (FR)

( * ) Notice: Subject to any disclaimer, the term of this patent is extended or adjusted under 35 U.S.C. 154(b) by 128 days.

(21) Appl. No.: 14/939,011

(22) Filed: Nov. 12, 2015

(65) Prior Publication Data

US 2016/0153635 A1 Jun. 2, 2016

(30) Foreign Application Priority Data

Nov. 27, 2014 (FR) ...................... 14 61587

(51) Int. Cl.
| | |
|---|---|
| *F21S 8/10* | (2006.01) |
| *B81B 3/00* | (2006.01) |
| *G02B 26/08* | (2006.01) |
| *H01L 41/09* | (2006.01) |
| *G02B 26/10* | (2006.01) |

(52) U.S. Cl.
CPC ........ *F21S 48/1757* (2013.01); *B81B 3/0021* (2013.01); *F21S 48/115* (2013.01); *F21S 48/1145* (2013.01); *F21S 48/1317* (2013.01); *F21S 48/1323* (2013.01); *G02B 26/0858* (2013.01); *G02B 26/10* (2013.01); *H01L 41/094* (2013.01)

(58) Field of Classification Search
CPC .......................... F21S 48/1757; F21S 48/1752
See application file for complete search history.

(56) References Cited

U.S. PATENT DOCUMENTS

| | | | |
|---|---|---|---|
| 5,253,098 A | 10/1993 | Hikita et al. | |
| 6,969,183 B2 * | 11/2005 | Okubo | ............... B60Q 1/085 |
| | | | 315/295 |
| 8,139,280 B2 | 3/2012 | Wu | |
| 8,217,555 B2 | 7/2012 | Ueda et al. | |
| 8,662,726 B2 | 3/2014 | Koike et al. | |
| 9,146,014 B2 * | 9/2015 | Sugiyama | ........... F21S 48/1388 |
| 9,458,977 B2 | 10/2016 | Sugiyama et al. | |
| 9,606,351 B2 * | 3/2017 | Yatsuda | ............... G02B 26/105 |

(Continued)

FOREIGN PATENT DOCUMENTS

| | | |
|---|---|---|
| DE | 102010021896 A1 | 12/2011 |
| EP | 2415638 A2 | 2/2012 |

(Continued)

*Primary Examiner* — Robert May
(74) *Attorney, Agent, or Firm* — Oblon, McClelland, Maier & Neustadt, L.L.P.

(57) ABSTRACT

A lighting system that includes a light source able to generate a light beam and means for scanning the light beam incorporating at least one oscillating reflective body for deflecting the path of the beam. The oscillating reflective body is moved by deformations of a piezoelectric operating member. The means for scanning the light beam also have optical means for amplifying the deflection of the path of the light beam positioned downstream of the reflective body, in relation to the propagation direction of the light beam.

18 Claims, 2 Drawing Sheets

(56) References Cited

U.S. PATENT DOCUMENTS

| | | | |
|---|---|---|---|
| 2007/0177250 A1* | 8/2007 | Duncan | G02B 26/101 359/298 |
| 2011/0013300 A1 | 1/2011 | Wu | |
| 2012/0043857 A1 | 2/2012 | Ueda et al. | |
| 2012/0327678 A1 | 12/2012 | Koike et al. | |
| 2013/0094235 A1 | 4/2013 | Sugiyama et al. | |
| 2014/0029282 A1 | 1/2014 | Ravier et al. | |
| 2015/0377447 A1 | 12/2015 | Sugiyama et al. | |
| 2016/0153632 A1* | 6/2016 | Mitterlehner | F21S 48/1145 250/214 R |

FOREIGN PATENT DOCUMENTS

| | | |
|---|---|---|
| EP | 2690352 A1 | 1/2014 |
| EP | 2767751 A1 | 8/2014 |
| FR | 2676833 A1 | 11/1992 |

\* cited by examiner

VEHICLE LIGHTING SYSTEM HAVING AN OSCILLATING REFLECTING BODY MOVED BY A PIEZOELECTRIC OPERATING MEMBER

CROSS-REFERENCE TO RELATED APPLICATIONS

This application claims priority to the French application 1461587 filed Nov. 27, 2014, which application is incorporated herein by reference and made a part hereof.

BACKGROUND OF THE INVENTION

1. Field of the Invention

The present invention relates to the technical domain of lighting systems for motor vehicles. More specifically, the invention relates to a lighting system forming a headlamp for a motor vehicle.

2. Description of the Related Art

A motor vehicle headlamp is primarily intended to illuminate the road and incorporates different optical systems and light sources.

It is known to use a headlamp in two different modes.

The first mode, commonly referred to as "low beam", generates lighting inclined slightly downwards in order to illuminate approximately 50 meters of the road in front of the vehicle without dazzling any drivers travelling in the opposite direction on the adjacent carriageway. In this operating mode, the driver is better able to see the short-distance environment when travelling at night or in difficult weather conditions (fog, snow, rain).

The second operating mode, commonly referred to as "high beam", generates high-intensity lighting in front of the vehicle and considerably increases the driver's field of vision, notably at nighttime and when it is snowing or raining. However, the orientation of the light beam is in this case liable to dazzle drivers travelling in the opposite direction on the adjacent carriageway or drivers travelling in front on the same carriageway, and as such it is necessary to switch to low beam when this situation occurs.

It is also known to provide an additional operating mode for the headlamp known as "adaptive driving beam" (ADB) or "selective beam", which generates "high beam" type lighting that is partially masked to prevent illumination of zones where there are vehicles coming from the opposite direction or vehicles travelling in front. This prevents other drivers from being dazzled while retaining a large field of vision. Document EP-2 415 638 may be referenced for more details on the ADB operating mode.

In this latter operating mode, the "selective beam" is generated by projection of a luminous image formed by scanning a light ray.

To obtain an image of adequate size, scanning must be performed on an angular sector with either a large angle or a large radius. In the latter case (large radius), the optical path is relatively long, so the means for generating the image to be projected are relatively bulky. In consideration of increasingly severe space constraints in the front of vehicles, it is preferable to perform the scanning on an angular sector with a large angle instead of a large radius. The scanning must therefore cover a sufficiently large angular sector, for example around 15°, in order to create a sufficiently large luminous image.

Devices for deflecting a light beam are already known in the prior art. However, such devices can only deflect a beam by up to 2°.

Document EP-2 690 352, which is equivalent to U.S. Publication 2014/0029282, proposes overcoming this problem using a scanning system incorporating articulated micro-mirrors that are able to scan a light beam over an adequate angular sector.

However, this system has a number of problems.

The micro-mirrors are mechanically fragile because they are subject to vibration and shocks that could upset the hinge lines of same, or even break same. Furthermore, they are thermally fragile because the reflection coefficient of same is not exactly 100% (it is usually around 90-99%). The micro-mirrors therefore have to absorb a portion of the energy carried by the light beam and the low thermal capacity of same (related to the low volume of same) results in a significant temperature increase that could damage same.

Furthermore, the micro-movements made by the mirrors subject same to fatigue stresses that progressively deteriorate same.

Finally, controlling such a system of micro-mirrors is relatively complex.

SUMMARY OF THE INVENTION

The invention is intended to provide a lighting system fitted with scanning means forming an image designed to be projected, these scanning means covering a sufficiently large angular sector, using simple and robust means.

For this purpose, the invention proposes a lighting system for a motor vehicle comprising:
  a light source able to generate a light beam, and
  means for scanning the light beam including at least one oscillating reflective body used to deflect the path of the beam,
  wherein the oscillating reflective body is moved by deformations of a piezoelectric operating member, the means for scanning the light beam also having optical means for amplifying the deflection of the path of the light beam positioned downstream of the reflective body, in relation to the propagation direction of the light beam.

Thus, the means for scanning the light beam make it possible to cover an angular sector of around 2°, and the optical amplification means make it possible to amplify same to achieve a satisfactory angular-sector angle. Since the elements involved in deflecting the light beam are the oscillating reflective body, the piezoelectric operating member and the optical amplification means, this lighting system is more robust and of simpler design than the lighting system in the prior art comprising micro-mirrors.

Advantageously, the oscillating reflective body is a metal strip.

Since metals generally have a reflection coefficient close to 1, the strip only absorbs a minute portion of the power of the light beam. Furthermore, the metal strip is solid, unlike the micro-mirrors in the prior art, and is therefore able to efficiently dissipate the limited energy transmitted by the light beam.

Advantageously, the oscillating reflective body forms a lever, this latter being moved by deformations of the piezoelectric operating member.

As is known, a lever is a simple machine that is particularly easy to operate.

Preferably, the reflective body forms a class three lever, the operating member acting on an operating portion of the lever positioned between a first hinged extremity of the lever and a second free extremity of the lever, the first hinged extremity preferably being formed by a fixed extremity of the lever that is able to bend elastically.

The force generated by the operating portion may result in this operating portion sliding on the lever, such that the lever then forms a lever of another class, notably a class two lever.

This enables the operating member to be easily arranged in relation to the reflective body.

According to one embodiment, the optical means for amplifying the deflection of the path of the light beam include a convex mirror, that is for example cylindrical or spherical.

According to another embodiment, the optical means for amplifying the deflection of the path of the light beam include a lens, preferably a diverging lens.

These optical means enable the oscillating reflective body to simply and efficiently amplify the scanning of the light beam in order to achieve a satisfactory angular-sector angle.

Advantageously, the lighting system also includes means for absorbing the light beam that are intended to absorb the light beam when the oscillating reflective body is in a predetermined idle position.

The invention also proposes a method for securing a lighting system, wherein the lighting system is as defined above and in that, when the piezoelectric operating member is deactivated, the oscillating reflective body is moved to the idle position of same.

Thus, when the oscillating reflective body is in the idle position of same, the absorption means absorb the light beam in order to prevent deterioration of the lighting system by overheating.

Advantageously, the lighting system also includes first means for controlling the deformations of the piezoelectric operating member and second means for controlling the light source.

The invention also proposes a method for securing a lighting system wherein the lighting system is as defined above and in that, when the first control means are deactivated, the light source is deactivated using second control means.

This prevents deterioration of the lighting system by overheating, in particular if the first control means are deactivated in an untimely manner.

These and other objects and advantages of the invention will be apparent from the following description, the accompanying drawings and the appended claims.

BRIEF DESCRIPTION OF THE ACCOMPANYING DRAWINGS

The invention can be better understood from the description given below, provided exclusively as an example, with reference to the drawings, in which.

DETAILED DESCRIPTION OF THE PREFERRED EMBODIMENTS

A lever is a simple machine usually divided into three classes.

A lever is referred to as a class one lever if the hinge point (fulcrum) of the lever is located between an operating portion of the lever to which an operating force of the lever is applied, and an active portion of the lever to which a resistance force is applied.

A lever is referred to as a class two lever if the active portion of the lever is positioned between the hinge point and the operating portion of the lever.

Finally, a lever is referred to as a class three lever if the operating portion of the lever is positioned between the hinge point and the active portion of the lever.

Figure 1:
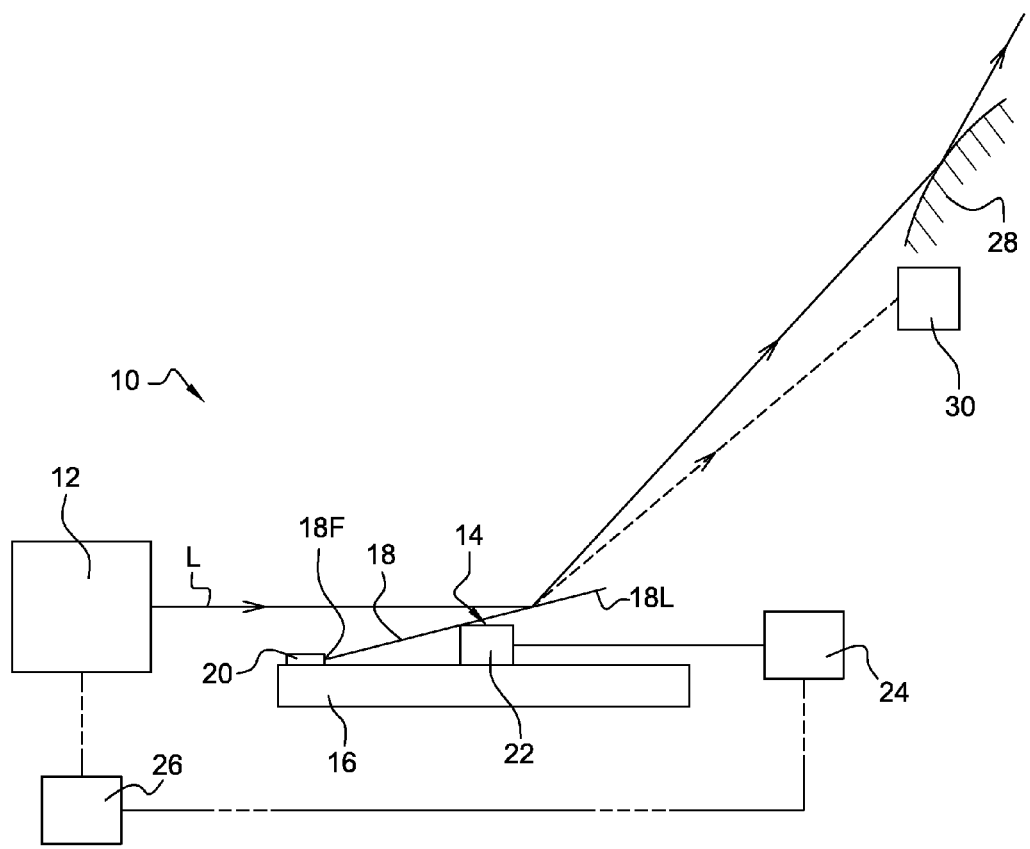
FIG. 1 is a schematic view of the lighting system according to the invention.

With reference to FIG. 1, a lighting system 10 for a motor vehicle includes a conventional light source 12. This includes for example a laser diode (not shown) emitting a substantially monochromatic light beam L.

Means 14 for scanning the light beam L are positioned on the path of the light beam L. These scanning means 14 include a static supporting element 16 rigidly connected to other optical elements of the lighting system 10, notably the light source 12, and an oscillating reflective body 18 attached to the static supporting element 16. Inclination of the reflective body 18 enables deflection of the light beam L. In this case, the reflective body 18 is formed by a metal strip, the reflection coefficient of which is close to 1, such that the loss of optical power in the light beam L by absorption into the strip is as low as possible. The reflective body 18 is attached to the static supporting element 16 by a weld 20 applied to an extremity 18F of the reflective body 18. The other extremity 18L of the reflective body 18 is free.

The scanning means 14 also include a piezoelectric operating member 22 placed between the static supporting element 16 and the reflective body 18. In the example described, the reflective body 18 forms a lever designed to be moved by the deformations of the piezoelectric operating member 22. More specifically, the reflective body 18 forms a class three lever, the operating member 22 acting on an operating portion of the lever positioned between a first hinged extremity of the lever and a second free extremity of the lever. The first hinged extremity is formed by the welded extremity 18F of the lever welded to the static supporting element 16 by means of the weld 20. This static extremity 18F is able to bend elastically.

Figure 3:
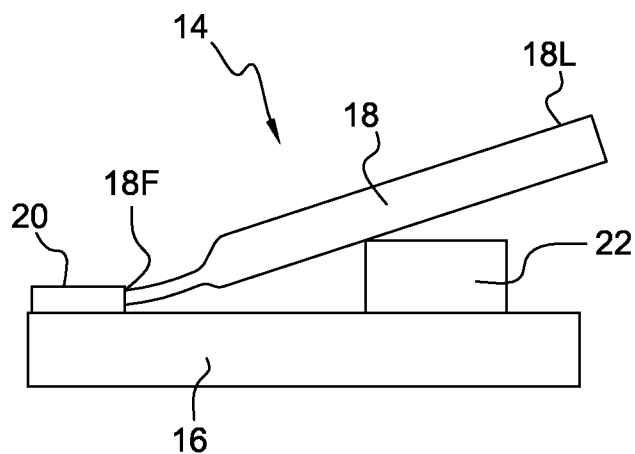
FIG. 3 is a larger scale view of the reflective body of the lighting system in FIG. 1.

With reference to FIG. 3, the metal strip forming the reflective body 18 is locally thin in the vicinity of the static extremity 18F of same, for example over 10% of the distance separating the extremities 18F and 18L, such as to facilitate the bending of the reflective body 18 by the deformations of the piezoelectric operating member 22. Conversely, the remainder of the metal strip is sufficiently thick, for example greater than 1 mm, to ensure that the deformations of the piezoelectric operating member 22 do not deform a reflection surface of the reflective body 18 intended to deflect the light beam L. This reflection surface therefore remains substantially flat, although the metal strip itself bends.

First control means 24 are connected to the piezoelectric operating member 22. These first control means 24 make it possible to control the current supplied to the piezoelectric operating member 22 by a power source (not shown), for example the battery of the vehicle in which the lighting system 10 is mounted.

When the piezoelectric operating member 22 is deactivated, i.e. when the first control means 24 determine the supply of a zero current to the piezoelectric operating member 22, the oscillating reflective body 18 occupies a predetermined position, referred to as the idle position.

Second control means 26 are connected to the light source 12 and to the first control means 24. When the latter are deactivated, such that the reflective body 18 occupies the idle position of same, the second control means 26 detect this idle positioning and deactivate the light source 12. The lighting system 10 is thus secured.

Optical means 28 for amplifying the deflection of the path of the light beam L are positioned downstream of the scanning means 14 in relation to the direction of propagation of the light beam L. These optical amplification means 28 are in this case formed by a cylindrical convex mirror, but may alternatively be formed by a spherical convex mirror or by a lens, preferably a diverging lens. The optical amplification means 28 make it possible to deflect the light beam L emitted by the light source 12 for a second time. In an example embodiment, the cylindrical mirror may have a radius of curvature of 25 mm. As detailed below, the geometric properties of the optical amplification means 28 are particularly suited to the intended use of same.

Conventional absorption means 30 are positioned on the optical path of the light beam L, downstream of the scanning means 14 in relation to the direction of propagation of the light beam L. These absorption means 30 are positioned to absorb the light beam L when the reflective body 18 is in the idle position of same, the light beam L not encountering the absorption means 30 when the first control means 24 determine the deformation of the operating member 22. This obviates all risk of deterioration caused for example by overheating of the elements of the lighting system 10 in the event of failure of the first control means 24 and extended exposure of these elements to the light beam L.

Figure 4:
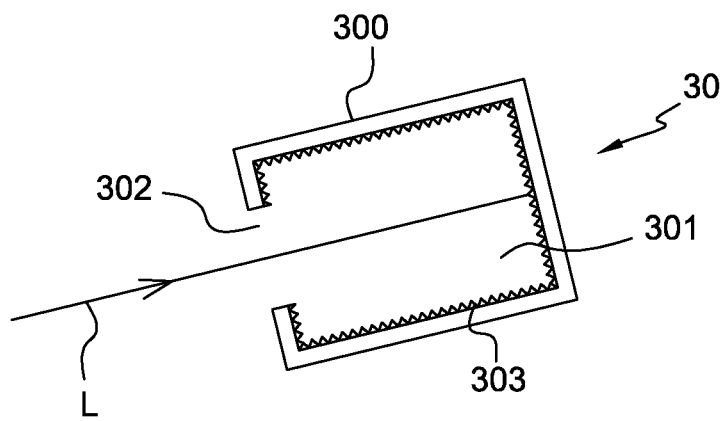
FIG. 4 is a larger scale view of the absorption means of the lighting system in FIG. 1.

In an example embodiment provided with reference to FIG. 4, these absorption means 30 include a box 300 having a cavity 301 and an opening 302. The walls of the cavity 301 are covered with an absorbent coating 303, for example a matte black diffusing paint or by anodizing. When the reflective body 18 is in the idle position of same, the light beam L enters the cavity through the opening 302. It impacts the back wall of the box 300 and is essentially absorbed by the coating 303. The low proportion of reflected light is diffused in the box 300 where it is essentially absorbed by the absorbent coating 303. Only a minute proportion of the light is liable to leak back out of the opening 302.

Operation of the lighting system 10 is described below.

The light source 12 emits a monochromatic light beam L towards the means 14 for scanning the light beam L. In particular, the light beam L is reflected by the reflective body 18. The first control means 24 control the piezoelectric operating member 22 to cause an oscillating deformation therein. This deformation causes the piezoelectric operating member 22 to move the reflective body 18, forming a lever such that this latter also oscillates and causes the scanning of the light beam L.

Figure 2:
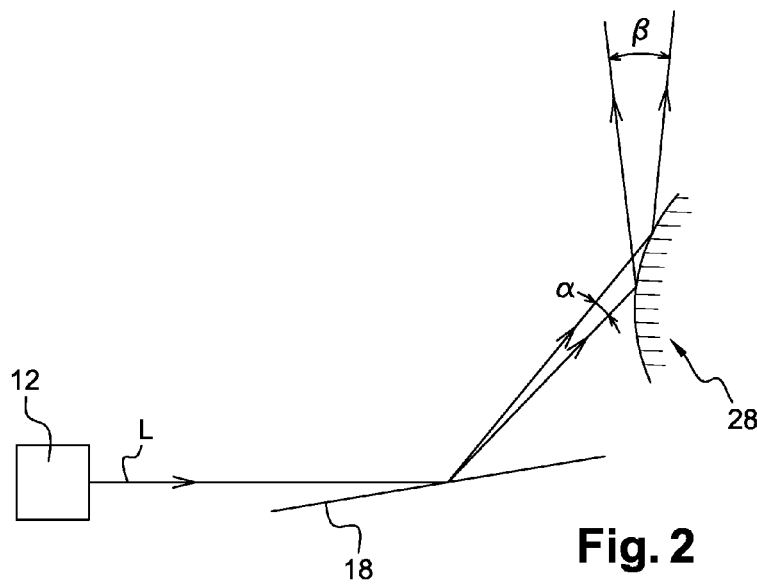
FIG. 2 is a simplified view of the lighting system in FIG. 1 showing the scanning of the light beam being propagated in the lighting system.

With reference to FIG. 2, the light beam L is scanned in a first non-null angular sector $\alpha$ by reflection on the reflective member 18 forming a lever that is subject to bending caused by the deformation of the piezoelectric operating member 22. In an example embodiment, using a conventional piezoelectric operating member 22 and conventional control means, the angle $\alpha$ of the first angular sector is around 1.5°.

The light beam is then propagated as far as the cylindrical mirror 28. The curvature of this latter amplifies the beam deflection, which is then scanned over a second angular sector $\beta$. With a cylindrical mirror with a radius of curvature of 25 mm and a distance traveled by the light beam L between the reflective body 18 in idle position and the cylindrical mirror 28 of around 35 mm, the angle $\beta$ of the second angular sector is around 15°.

The light beam L is then propagated as far as a known wavelength conversion device (not shown), for example containing phosphorus. The latter then forms a white luminous image resulting from the scanning of the monochromatic light beam. The luminous image is then projected by known projection means (not shown) such as to emit the light towards a space to be illuminated.

To ensure the safety of the lighting system 10, in particular with regard to unforeseeable operating incidents, when the piezoelectric operating member 22 is deactivated, the oscillating reflective body 18 is moved to the idle position of same, or when the first control means 24 are deactivated, the light source 12 is deactivated using the second control means 26.

Naturally, numerous modifications may be made to the invention without thereby moving outside the scope of same.

Control of the light beam L may include a feedback loop to improve operational reliability of the lighting system 10.

The optical means 28 for amplifying the deflection of the path of the light beam L may include a concave mirror, which has the advantage of reversing the images, for example between the right and left of the light beam L.

Furthermore, a single control program for the first control means 24 for a left-hand headlamp and for a right-hand headlamp of the motor vehicle may be used.

The absorption means 30 may simply comprise a wall covered with black matte paint.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A lighting system for a motor vehicle, comprising:
   a light source able to generate a light beam (L); and
   means for scanning said light beam (L) including at least one oscillating reflective body used to deflect a path of the light beam (L);
   wherein said at least one oscillating reflective body is moved by deformations of a piezoelectric operating member, said means for scanning said light beam (L) also having optical means for amplifying a deflection of said path of said light beam (L) positioned downstream of said at least one oscillating reflective body, in relation to the propagation direction of said light beam (L);
   wherein said at least one oscillating reflective body forms a lever, said lever being moved by said deformations of said piezoelectric operating member; and
   wherein said at least one oscillating reflective body forms a class three lever, said piezoelectric operating member acting on an operating portion of said lever positioned between a first hinged extremity of said lever and a second free extremity of said lever, said first hinged extremity being formed by a fixed extremity of said lever that is able to bend elastically.

2. The lighting system according to claim 1, wherein said at least one oscillating reflective body is a metal strip.

3. The lighting system according to claim 2, wherein said at least one oscillating reflective body forms a lever, said lever being moved by said deformations of said piezoelectric operating member.

4. The lighting system according to claim 2, wherein said optical means for amplifying said deflection of said path of said light beam (L) include a convex mirror, that is cylindrical or spherical.

5. The lighting system according to claim 1, wherein said optical means for amplifying said deflection of said path of said light beam (L) include a convex mirror, that is cylindrical or spherical.

6. The lighting system according to claim 1, wherein said optical means for amplifying said deflection of said path of said light beam (L) includes a lens.

7. The lighting system according to claim 6, wherein said lens is a diverging lens.

8. The lighting system according to claim 1, also including means for absorbing said light beam (L) that are intended to absorb said light beam (L) when said at least one oscillating reflective body is in a predetermined idle position.

9. A method for securing a lighting system, wherein said lighting system is as recited in claim 8, and in that, when said piezoelectric operating member is deactivated, said at least one oscillating reflective body is moved to an idle position.

10. The lighting system according to claim 1, also including a first control for controlling said deformations of said piezoelectric operating member and a second control for controlling said light source.

11. A method for securing a lighting system, wherein said lighting system is as recited in claim 10, and in that, when said first control is deactivated, said light source is deactivated using said second control.

12. A lighting system for a motor vehicle, comprising:
a light source able to generate a light beam (L); and
a scanner of said light beam (L) including at least one oscillating reflective body used to deflect a path of the light beam (L);
wherein said at least one oscillating reflective body is moved by deformations of a piezoelectric operating member, said scanner of said light beam (L) also having optical means for amplifying a deflection of said path of said light beam (L) positioned downstream of said at least one oscillating reflective body, in relation to the propagation direction of said light beam (L);
wherein said at least one oscillating reflective body forms a lever, said lever being moved by said deformations of said piezoelectric operating member; and
wherein said at least one oscillating reflective body forms a class three lever, said piezoelectric operating member acting on an operating portion of said lever positioned between a first hinged extremity of said lever and a second free extremity of said lever, said first hinged extremity preferably being formed by a fixed extremity of said lever that is able to bend elastically.

13. The lighting system according to claim 12, wherein said at least one oscillating reflective body is a metal strip.

14. The lighting system according to claim 12, wherein said optical means for amplifying said deflection of said path of said light beam (L) include a convex mirror, that is cylindrical or spherical.

15. The lighting system according to claim 12, wherein said optical means for amplifying said deflection of said path of said light beam (L) includes a lens.

16. The lighting system according to claim 15, wherein said lens is a diverging lens.

17. The lighting system according to claim 12, also including means for absorbing said light beam (L) that are intended to absorb said light beam (L) when said at least one oscillating reflective body is in a predetermined idle position.

18. The lighting system according to claim 12, also including a first control for controlling said deformations of said piezoelectric operating member and a second control for controlling said light source.

* * * * *